(12) United States Patent
Lilley

(10) Patent No.: US 7,277,812 B1
(45) Date of Patent: Oct. 2, 2007

(54) DATA GENERATOR

(75) Inventor: Jennifer R. Lilley, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/061,795

(22) Filed: Feb. 18, 2005

(51) Int. Cl.
*G01R 31/14* (2006.01)

(52) U.S. Cl. .................................................. 702/117
(58) Field of Classification Search ................. 702/117
See application file for complete search history.

(56) References Cited

U.S. PATENT DOCUMENTS

| 4,833,464 | A | * | 5/1989 | Di Santo et al. ............ 345/107 |
| 5,572,444 | A | * | 11/1996 | Lentz et al. ................. 702/117 |
| 5,914,616 | A | | 6/1999 | Young et al. |
| 6,182,247 | B1 | * | 1/2001 | Herrmann et al. ............ 714/39 |
| 6,492,802 | B1 | * | 12/2002 | Bielski ..................... 324/158.1 |
| 2005/0071108 | A1 | * | 3/2005 | Kulidjian et al. ............ 702/117 |

OTHER PUBLICATIONS

U.S. Appl. No. 10/683,944, filed Oct. 10, 2003, Young.
Xilinx, Inc., "High Performance Multi Port Memory Controller", Application Note, XAP535, (v1.1), Jul. 23, 2004, pp. 1-220, available from Xilinx, Inc., 2100 Logic Drive, San Jose, CA 95124.

* cited by examiner

*Primary Examiner*—Bryan Bui
*Assistant Examiner*—Jonathan Moffat
(74) *Attorney, Agent, or Firm*—W. Eric Webostad

(57) ABSTRACT

A data generator configured to provide a predictable data pattern, including system and product-by-process therefore, is described. The data generator is coupled to a circuit under test via a first data interface. The data generator is configured to generate a predictable data pattern for the circuit under test. The predictable data pattern is associated with display on a screen. A display controller is coupled to the circuit under test via a second data interface. At least one of a data monitor and a display device is coupled to the display controller.

15 Claims, 11 Drawing Sheets

| 1000 | | | | | | | | | |
|---|---|---|---|---|---|---|---|---|---|
| CONTROL 0<br>1001 | COLORBAR PATTERN CONTROL RED 0<br>1002 | COLORBAR PATTERN CONTROL RED 1<br>1003 | COLORBAR PATTERN CONTROL GREEN 0<br>1004 | COLORBAR PATTERN CONTROL GREEN 1<br>1005 | COLORBAR PATTERN CONTROL BLUE 0<br>1006 | COLORBAR PATTERN CONTROL BLUE 1<br>1007 | DCR TIMER MAX<br>1008 | DCR TIMER MISS<br>1009 | CONTROL 1<br>1010 |

FIG. 10

DATA GENERATOR

FIELD OF THE INVENTION

One or more aspects of the invention relate generally to data generation and, more particularly, to a data generator configured to provide a predictable data pattern.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.) Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines".

Another such FPGA, the Xilinx Virtex®-II FPGA, is described in detail in pages 33-75 of the "Virtex-II Platform FPGA Handbook", published December, 2000, available from Xilinx, Inc., 2100 Logic Drive, San Jose, Calif. 95124. And yet another such FPGA, the Xilinx Virtex-II Pro™ FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124.

Another type of PLD is the Complex Programmable Logic Device ("CPLD"). A CPLD includes two or more "junction blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, performance of a design instantiated in programmably configurable circuitry of an FPGA ("FPGA fabric") was tested by supplying data externally with respect to the FPGA.

Accordingly, it would be desirable and useful to provide means to generate data internally within an integrated circuit for testing.

SUMMARY OF THE INVENTION

One or more aspects of the invention generally relate to data generation and, more particularly, to a data generator configured to provide a predictable data pattern.

An aspect of the invention is a system for testing a circuit under test, the system comprising an integrated circuit coupled to a data monitoring device. A data generator is coupled to the circuit under test via a first data interface. The data generator is configured to generate a predictable data pattern for the circuit under test. The predictable data pattern is associated with a screen display. A display controller is coupled to the circuit under test via a second data interface. At least one of a data monitor and a display device is coupled to the display controller.

Another aspect of the invention is a data generator. A pattern generation counter is configured to count pixel information, row information, and column information for displaying a data test pattern on a display screen. The data test pattern is divided into groups of pixels divided out by rows and columns. Display modules are coupled to the pattern generation counter and configured to gradually adjust the pixel information for the data test pattern.

Yet another aspect of the invention is a data test pattern for testing a circuit. The data test pattern is provided from the method comprising counting rows associated with a display resolution and columns associated with pixel groupings of the display resolution. For an upper portion of the data test pattern, each pixel is up counted within each pixel grouping in each column of the columns responsive to counting a first portion of the rows associated with the upper portion of the data test pattern. For a lower portion of the data test pattern, each pixel is down counted within each pixel grouping in each column of the columns responsive to counting a second portion of the rows associated with the lower portion of the data test pattern. Gradually adjusted first, second and third color information is generated responsive to the column counting and the up counting for combination of the first, second, and third color information for each said pixel in the upper portion of the data test pattern. Gradually adjusted first, second and third color information is generated responsive to the column counting and the down counting for combination of the first, second, and third color information for each said pixel in the lower portion of the data test pattern.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 10 is a high-level block diagram depicting an exemplary embodiment of a register interface for programming the data generator of FIG. 2.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different. Moreover, though single signal lines, logic elements, circuits, and circuit elements may be shown in the accompanying drawings for purposes of clarity, multiple or single versions thereof may be implemented.

Figure 1:
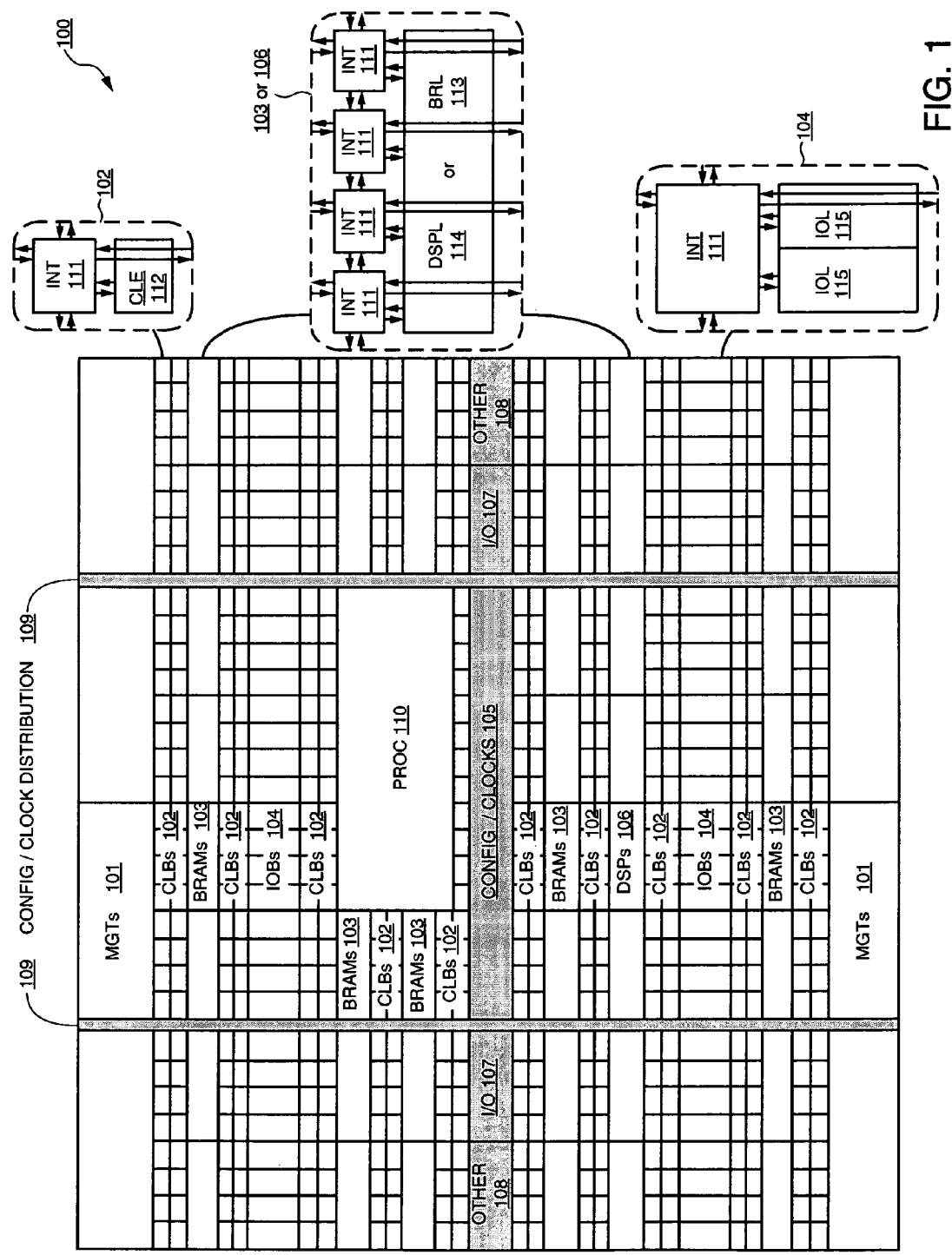
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. Additional details regarding a columnar architected FPGA may be found in a co-pending patent application, namely, U.S. patent application Ser. No. 10/683,944 entitled, "Columnar Architecture" by Steve P. Young, filed Oct. 10, 2003.

FPGA 100 illustratively represents a columnar architecture, though FPGAs of other architectures, such as ring architectures for example, may be used. FPGA 100 may be a Virtex-4™ FPGA from Xilinx of San Jose, Calif. The Xilinx Virtex-4™ FPGA is described in detail in each of the following publications: "Virtex-4 User Guide" version 1.1 [online], Xilinx Inc., 2004, [retrieved on 2004 Dec. 16], retrieved from the Internet <http://direct.xilinx.com/bvdocs/userguides/ug070.pdf>; "Virtex-4 Packaging and Pinout Specification" publication UG075 (v2.0) [online], Xilinx Inc., 2004, [retrieved on 2004 Dec. 16], retrieved from the Internet <http://direct.xilinx.com/bvdocs/userguides/ug075.pdf>; "Virtex-4 Data Sheet: DC and Switching Characteristics" publication DS302 (v1.1) [online], Xilinx Inc., 2004, [retrieved on 2004 Dec. 16], retrieved from the Internet <http://direct.xilinx.com/bvdocs/publications/ds302.pdf>; and "Virtex-4 Family Overview" publication DS112 (v1.2) [online], Xilinx Inc., 2004, [retrieved on 2004 Dec. 16], retrieved from the Internet <http://direct.xilinx.com/bvdocs/publications/ds112.pdf>. FPGA 100 may have an embedded processor, which in the Virtex-4 FPGA is an embedded PowerPC™ 405 Core. PowerPC™ 405 Core is described in detail in each of the following publications: "PowerPC™ 405 Processor Block Reference Guide" publication UG018 (v2.0) [online], Xilinx Inc., 2004, [retrieved on 2004 Dec. 16], retrieved from the Internet <http://direct.xilinx.com/bvdocs/userguides/ug018.pdf>; and "PowerPC 405 Processor Block Reference Guide" publication EDK 6.1 [online], Xilinx Inc., 2003, [retrieved on 2004 Dec. 16], retrieved from the Internet <http://direct.xilinx.com/bvdocs/userguides/ppc_ref_guide.pdf>.

What follows is a description of a data generator, which may be implemented in an integrated circuit. Though the data generator described is implemented in an FPGA, it should be appreciated that any integrated circuit having a hardware test system, such as a built-in self-test system, or a configured-in self-test system implemented with programmable logic, may employ such a data generator. The data generator described herein generates a completely predictable pattern of data. Moreover, the data generator may use software accessible parameters for dynamically changing data sequence values, or dynamically changing timing of generated data, or both. Accordingly, the data generator may be employed for monitoring system performance. In addition, the described data generator may be coupled to a video display. Data output to the video display may be visualized in the form of color patterns. Thus, a developer may visually identify data corruption on such a display to facilitate identification of a problem to shorten the time needed for debugging.

It should be appreciated that by using the data generator, time to transfer a design into hardware may be significantly reduced as a developer need not wait for complex tests to be written. More particularly, when one developer is debugging a design using the data generator, another developer may work on more complicated tests that are specific to the design. Thus, it should be appreciated that the data generator may be used to test core functions of an integrated circuit using provided predictable data which should output a likewise predictable output. Moreover, it will be appreciated that the data generator described below is compact and portable to designs other than the example FPGA implementation. Along those lines, the below described data generator is described with reference to known standard interfaces. In the implementation below, Device Control Registers ("DCRs") are employed to configure parameters for the data generator, and a LocalLink interface is used to send streaming data to a system. These are merely examples of interfaces that may be used, but such interfaces may be replaced by other known interfaces. For example, interfaces that could be used to replace DCRs include a processor local bus ("PLB") interface, an on-chip peripheral bus ("OPB") interface, or any other interface that can be used to configure status/control registers, and interfaces that may be used to replace a LocalLink interface include a PLB interface, an OPB interface, or any other interface that can be used to transmit data as set forth herein. Furthermore, it should be appreciated that although data is described below as being displayed in a colorbar pattern, it should be appreciated that other patterns may be used for providing a visual indication of where an error has occurred in response to processing a predictable data input.

Figure 2:
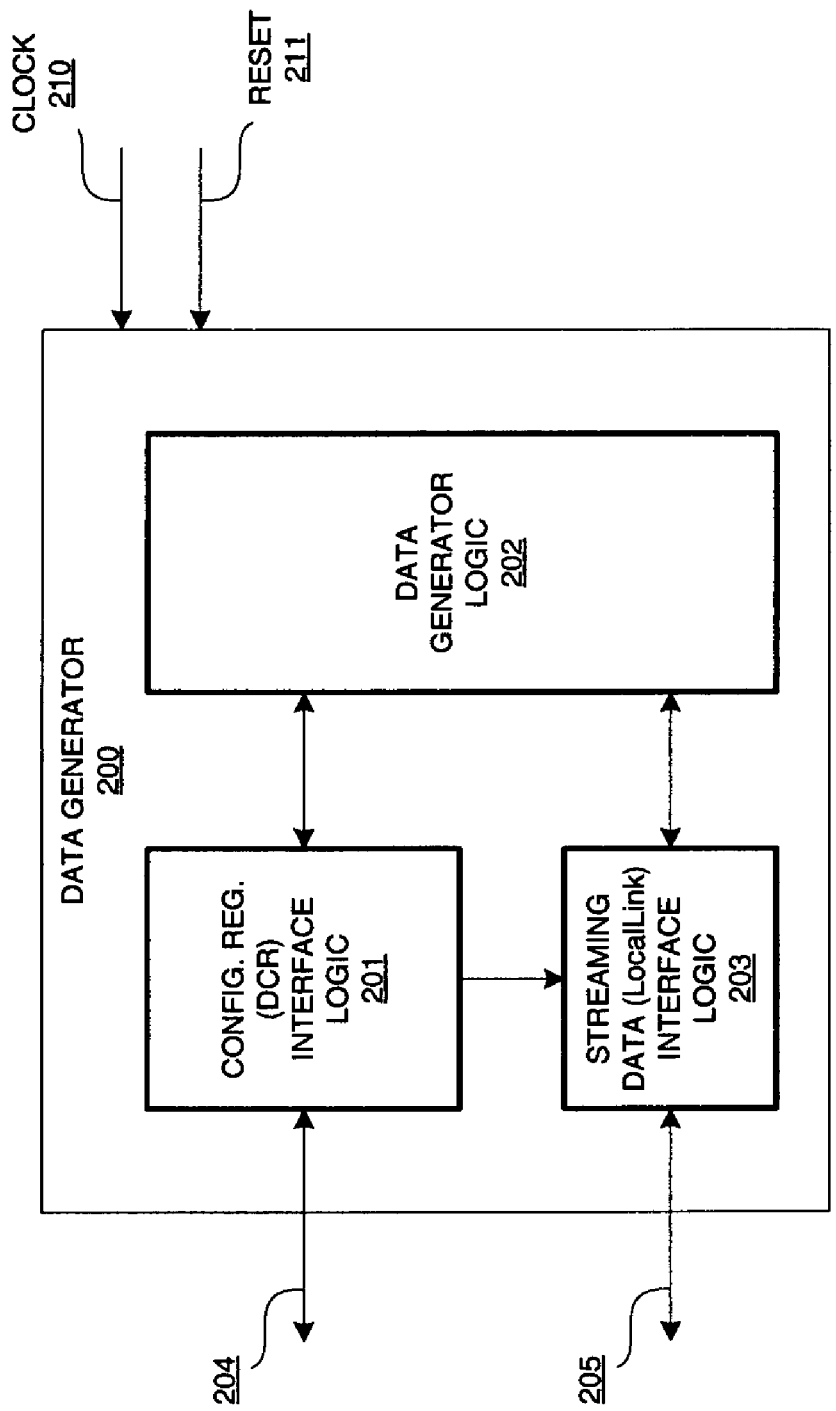
FIG. 2 is a high-level block diagram depicting an exemplary embodiment of a data generator.

FIG. 2 is a high-level block diagram depicting an exemplary embodiment of a data generator 200. Data generator 200 includes DCR interface logic 201, LocalLink interface logic 203, and data generator logic 202. Data generator logic 202 is coupled to DCR interface logic 201 and LocalLink interface logic 203 for bidirectional communication with each of those blocks. DCR interface logic 201 is coupled to LocalLink interface logic 203 for communication thereto. An example of FIG. 2 is given in the Xilinx, Inc. Application note, XAPP535, Jul. 23, 2004 and entitled High Performance Multi port Memory Controller; the contents of which are herein incorporated by reference.

A clock signal 210 and a reset signal 211 may be provided to data generator 200. Busing 204 to DCR interface logic 201 may include known signaling for communication with a DCR interface and busing 205 may include known signaling for communication with a LocalLink interface logic 203. Busing 204 is coupled to DCR bus 310 of FIG. 3. A portion of busing 205 is coupled to DCR bus 310 of FIG. 3 and another portion of busing 205 is coupled to LocalLink (LL) interface 314 of FIG. 3. Signaling to DCR interface logic 201 may include a DCR write signal, a DCR read signal, a DCR address bus signal, and a DCR data bus input signal. Signaling from DCR interface logic 201 may include a DCR acknowledge signal, and a DCR data bus output signal. Signaling from LocalLink interface logic 203 may include a LocalLink source ready signal, LocalLink start of frame signal, LocalLink start of packet signal, LocalLink end of packet signal, LocalLink end of frame signal, LocalLink data signal, and LocalLink byte enable ("Rem") signal. A signal which may be provided to LocalLink interface logic 203 includes a LocalLink destination ready signal.

Figure 3:
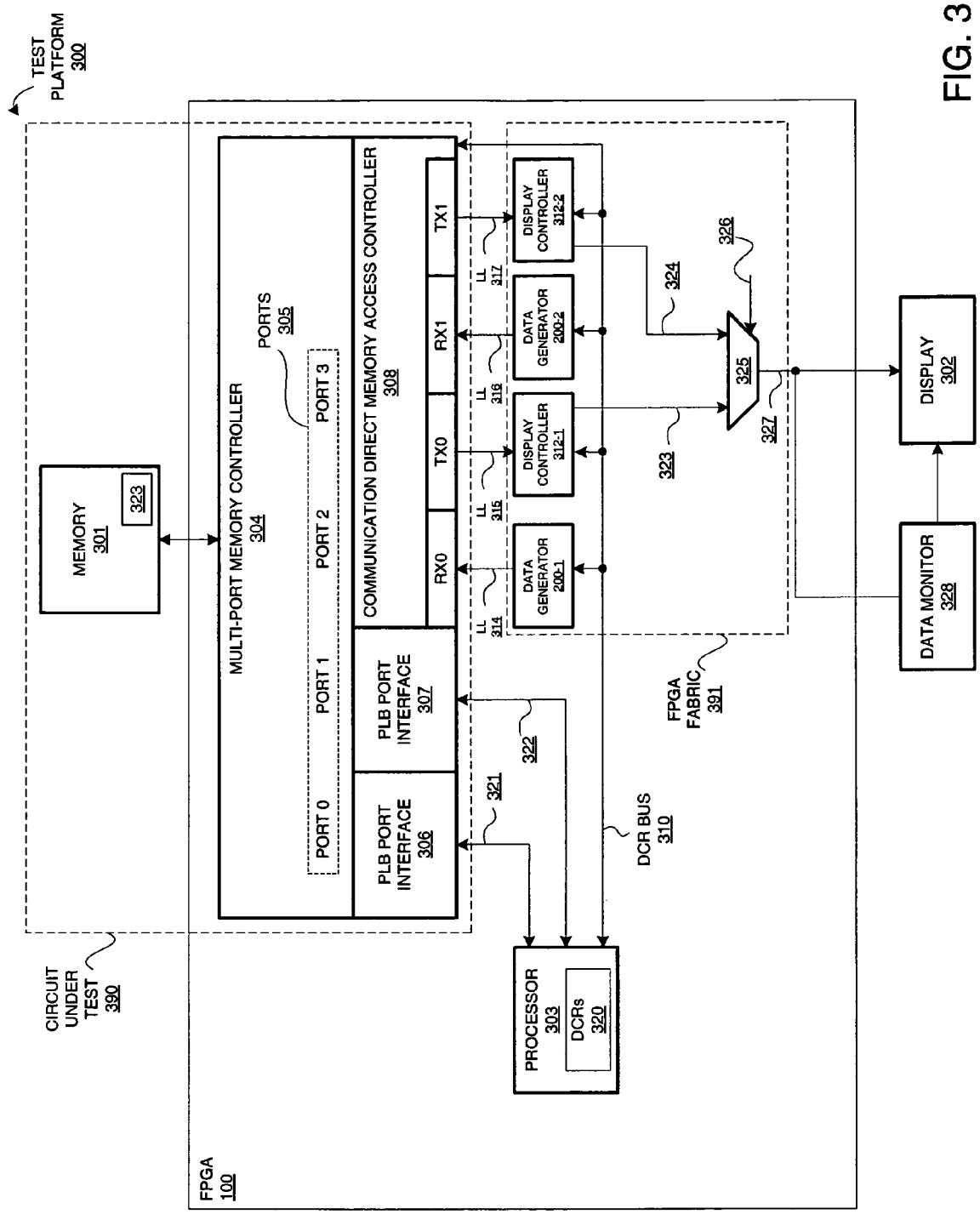
FIG. 3 is a block diagram depicting an exemplary embodiment of a test platform in which one or more data generators of FIG. 2 may be employed.

Data generator 200 is configured to generate pixels according to settings of DCRs of a processor, such as DCRs 320 of processor 303 as shown in FIG. 3. For the implementation described herein, such DCRs are configured for color settings, though a grayscale may be used, and a default colorbar pattern 400 is illustratively shown in FIG. 4. Once data generator 200 has generated data, such data is sent across a LocalLink interface via LocalLink interface logic 203 of data generator 200. DCR interface logic 201 is optional, as data generator 200 will generate default colorbar pattern 400 of FIG. 4 whether or not data generator 200 is coupled to a processor, such as processor 303 of FIG. 3. However, DCR interface logic 201 may be used to facilitate communication with processor 303 of FIG. 3 to configure color patterns other than default colorbar pattern 400 of FIG. 4. Furthermore, optional DCR interface logic 201 may be used to control speed of communication via a LocalLink interface to which data generator is coupled via LocalLink interface logic 203. For example, it may be desirable to slow data generator 200 to generate system level performance metrics associated with a slowing down of a data rate across the LocalLink interface to emulate lower speed devices.

FIG. 3 is a block diagram depicting an exemplary embodiment of a test platform 300 in which one or more data generators 200 of FIG. 2 may be employed. This platform 300 includes FPGA 100 coupled to memory 301 and to display 302. Memory 301 may be any conventional memory for storing data and reading such data back. In this implementation, memory 301 is a double data rate ("DDR") synchronous dynamic random access memory ("SDRAM"), though other known memories may be used. Memory 301 may be coupled to a multi-port memory controller ("MPMC") 304 of FPGA 100. MPMC 304 may include a plurality of ports 305. In this example, port 0, port 1, port 2, and port 3 are shown, though fewer or more ports may be used. MPMC 304 may be coupled to processor local bus ("PLB") port interface 306, PLB port interface 307, and communication direct memory access controller ("CDMAC") 308. For example, port 0 may be associated with PLB port interface 306, port 1 may be associated with PLB port interface 307, and ports 2 and 3 may be associated with CDMAC 308. PLB port interfaces 306 and 307 may be coupled to processor 303 via an instruction-side PLB 321 and a data-side PLB 322, respectively. Thus processor 303 may communicate with memory 301.

CDMAC 308 is coupled to one or more receivers and one or more transmitters. In this exemplary implementation, receivers RX0 and RX1 and transmitters TX0 and TX1 are coupled to CDMAC 308.

One or more data generators may be implemented in FPGA 100. In this example, data generator 200-1 and data generator 200-2, which have previously been described at a high level with reference to data generator 200 of FIG. 2, are illustratively shown implemented in FPGA 100. Data generator 200-1 is coupled between DCR bus 310 and receiver RX0. Data generator 200-1 is coupled to receiver RX0 via LocalLink interface 314. LocalLink interface 315 couples transmitter TX0 to display controller 312-1. Display controller 312-1 is coupled to DCR bus 310. Notably, data generator 200-2 and display controller 312-2 are respectively coupled to receiver RX1 and transmitter TX1 via LocalLink interface 316 and LocalLink interface 317. Moreover, data generator 200-2 and display controller 312-2 are coupled to DCR bus 310.

Outputs from display controllers 312-1 and 312-2, namely video data streams 323 and 324, respectively, are both provided as data inputs to multiplexer 325, the output of which is selectable under control of display select signal 326. It should be appreciated that more than one display controller and more than one data generator may be implemented in FPGA 100 of test platform 300. However, because operation of data generator 200-1 and display controller 312-1 will be the same for data generator 200-2 and display controller 312-2, only one set is described for purposes of clarity. Accordingly, it shall be assumed that only video data stream 323 is provided as output 327 of multiplexer 325 for receipt and processing by display 302.

As previously mentioned, processor 303 includes DCRs 320. DCRs 320 may be put in communication with data generator 200-1 and display controller 312-1 via DCR bus 310. DCRs 320 may be subject to control via processor 303 or, more particularly, via software implemented for controlling DCRs 320 via processor 303. Such programmable control may be used to configure data generator 200-1 and display controller 312-1.

Thus, for a test operation, assuming data generator 200-1 is in either a user-customized or a default state, data generator 200-1 generates a colorbar data pattern. This colorbar data pattern is provided to receiver RX0 via LocalLink interface 314. Receiver RX0, under control of CDMAC 308, provides such data to a port, such as port 2, of MPMC 304 for output to memory 301. Thus, the data provided from data generator 200-1 is written to memory 301. This data pattern, generally indicated as block 323 stored in memory 301, is read back via MPMC 304 to display controller 312-1. More particularly, the data is provided via a port, such as port 3, of MPMC 304 to transmitter TX0 under control of CDMAC 308 to display controller 312-1. Display controller 312-1 provides such output data pattern to multiplexer 325 for display on display 302. Notably, in an error-free system, data provided from data generator 200-1 will be the same data read back from memory 301 as displayed on display 302, as generally indicated by block 323 and video data stream 323 having the same reference number. However, the data displayed on display 302 will not be the same data sent from data generator 200-1 if an error occurs between data generator 200-1 sending such data and its eventual display on display 302.

Thus, it should be appreciated that known data is sent to be received by CDMAC 308 via a LocalLink interface receiver. CDMAC 308 receives such data and places it in memory 301 specified by one or more Direct Memory Access ("DMA") descriptors. This data generated is a colorbar pattern for display on display 302, which may be a video display. Any irregularities in display of the colorbar pattern on display 302 may be used to indicate an error, including where such error may have originated, for debugging. In this particular example, receiver RX0, transmitter TX0, CDMAC 308, MPMC 304, and memory 301 are all within the debugging path. Thus, one or more of these circuits may be a circuit under test ("CUT") 390. Such CUT 390 may be internal or external to FPGA 100. Moreover, though dedicated circuits are illustratively shown as a CUT 390, a CUT may include a design instantiated in FPGA fabric 391. Thus, CUT 390 may be at least partially instantiated in FPGA fabric 391. Furthermore, though data generator 200-1, display controller 312-1, and multiplexer 325 are illustratively shown as being instantiated in configurable logic of FPGA fabric 391, one or more of these circuits may be formed from dedicated logic.

Figure 4:
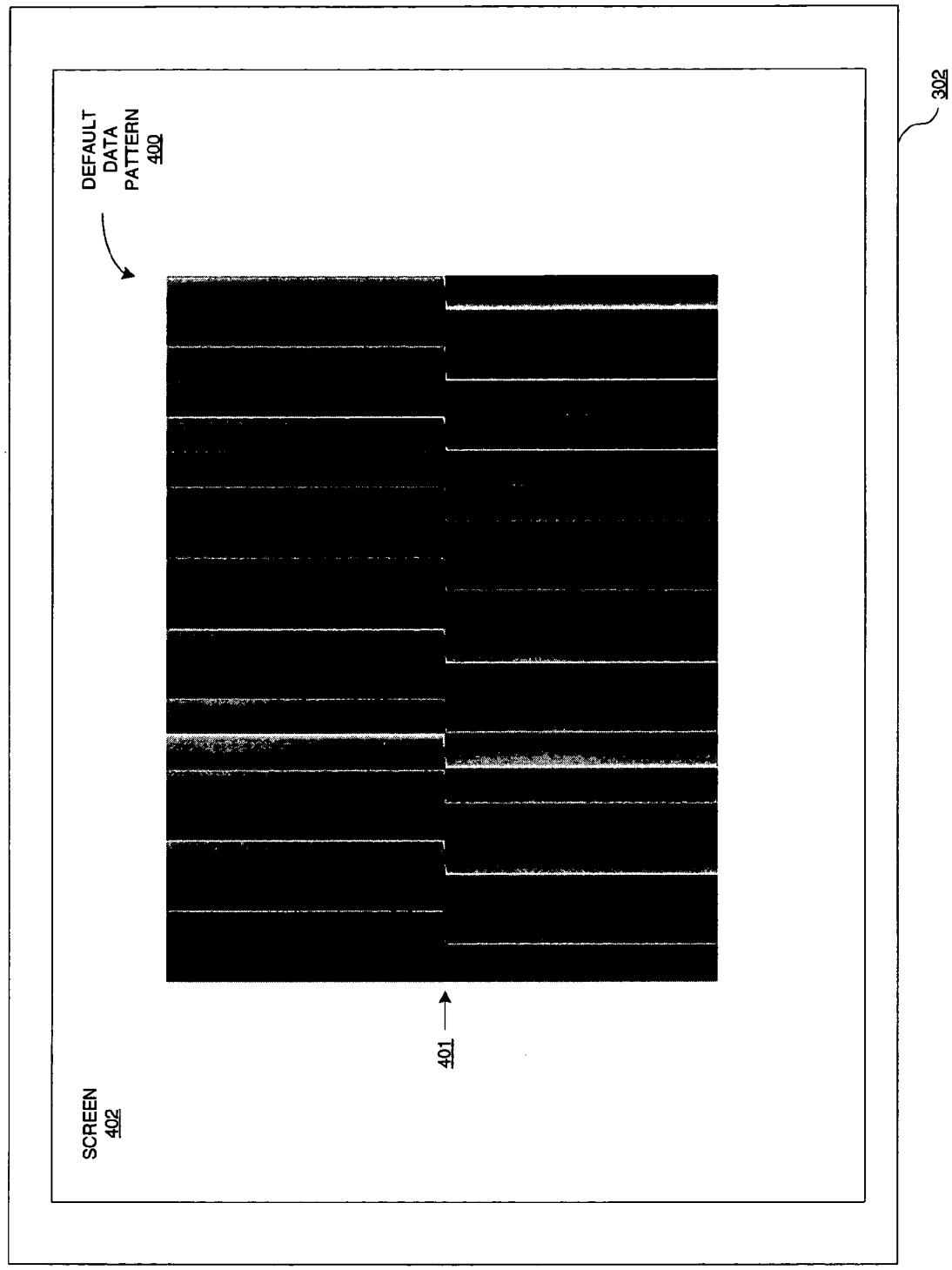
FIG. 4 is a pictorial view depicting an exemplary embodiment of a default colorbar pattern.

FIG. 4 is a pictorial view depicting an exemplary embodiment of a default colorbar pattern 400. Default pattern 400, though shown in grayscale here, is displayed on display screen 402 of display 302. Again, it should be understood that any repetitive pattern or identification of data errors may be used, and thus patterns other than default pattern 400 may be used. In an implementation, default pattern 400 is a 640 pixel by 480 line image generated at 32 bits per pixel. In other words, data generator 200 of FIG. 2 may be used to produce data sufficient to fill an entire VGA screen. Notably, display formats other than VGA may be used and thus fewer or more data samples may be generated for display.

With simultaneous reference to FIGS. 2, 3, and 4, data generation is further described. In an implementation, the form of data sent across a 32-bit LocalLink interface, such as LocalLink interfaces 314 and 315, originates from data generator 200-1 as 0xAARRGGBB, where AA is a constant 0xAA, RR is an 8-bit red value, GG is an 8-bit green color value, and BB is an 8-bit blue color value. It shall be appreciated from the description that follows that only the upper 6 bits of each of the data colors is used in this implementation, though fewer or more than these bits may be used. Moreover, actual data patterns by data generator 200 are controllable in software via configuring DCRs 320 for providing such configuration information to data generator 200 via DCR bus 310.

Again, DCR interface logic 201 is optional, though it provides a programmable means to alter behavior of data generator 200, namely the alteration of color data and data pattern, as well as control of LocalLink data rate. With respect to the former, DCR interface logic 201 may be used to modify colorbar patterns generated and thus see differing frames of data. With respect to the latter, DCR interface logic 201 may be used to set up performance metrics, such as for MPMC 304 and CDMAC 308, for example. For example, processor 303 may set up specific or variable numbers of clock cycles that LocalLink interface logic 203 waits between before sending data generated by data generator logic 202. LocalLink interface logic 203 may be used to initiate a single frame of LocalLink data per line of video data, including LocalLink header, payload, and footer, for output from data generator 200. Thus, LocalLink interface logic 203 communicates with data generator logic 202 to obtain such data, and such data may be controlled via DCR interface logic 201 settings with respect to data transmission speed for output of such data from LocalLink interface logic 203 to receiver RX0. Thus, in this VGA example, data generator 200 sends 480 LocalLink frames of data for each video field.

Figure 5:
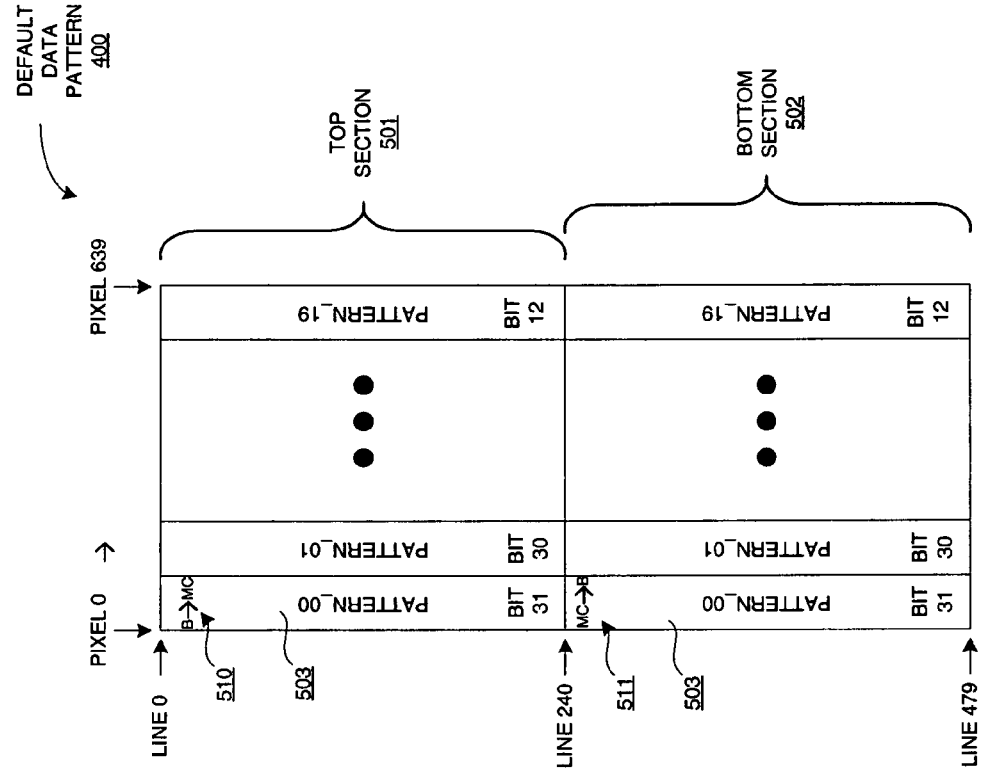
FIG. 5 is a block diagram depicting an exemplary embodiment of a default data pattern.

FIG. 5 is a block diagram depicting an exemplary embodiment of a default data pattern 400 generated by data generator 200 of FIG. 2. In this example, a VGA screen of data is generated by data generator 200. The screen of data is split into two sections of 240 lines each, namely from line 0 to line 239 and from line 240 to line 479. Top section 501 and bottom section 502 each have patterns 00 through 19. Patterns 00 through 19 represent bars for display. Each bar 503 is associated with a bit. In this example, patterns 19 through 00 are respectively associated with bits 12 through 31. These 20 bars are divided into 640 pixels such that each bar across a line thereof has 32 pixels of video data. For top section 501, bars 503 start at the left at a black setting and then gradually increase towards a maximum color brightness, as generally indicated by arrow 510. Thus, within each bar 503, from a starting location, such as line 0, pixel 0, each pixel is successively increased in brightness toward a set maximum color brightness ("maximum color"). Notably, a maximum color need not be used as an end point. Moreover, the starting point need not be black. However, the gradient from a starting point to an ending point facilitates visual identification of data error. In contrast to top section 501, bottom section 502 has its starting point a maximum color which is successively stepped down in brightness to black as generally indicated by arrow 511. Thus each pattern section 501 and 502 has its own gradient, which in this example is between black and a maximum color setting in 32 steps, though in opposite directions. Maximum color, as well as starting position, for each pattern may be specified, for example, using colorbar pattern control registers of DCRs 320. Because each gradient step represents a single pixel, each gradient change corresponds to a single pixel of video data.

Because default data pattern 400 is divided into a top section 501 and a bottom section 502 having contrasting gradients, a visual indication of a line across the screen generally at line 240 is created. It should be appreciated that this line, which is visually perceptible, provides a dividing line to indicate whether or not a central part of the data pattern is shifting up or down. Without this visual indication, it may not be possible to detect an error causing a shift or other offset vertically with respect to such data pattern. However, with such a visually perceptible delineation, generally indicated as line 401 of FIG. 4, a user may be able to identify whether or not the pattern is shifting up or down. Notably, if an error is only occasional, it may be difficult to catch visually. Accordingly, a data monitor 328, as illustratively shown in FIG. 3, may be coupled to streaming video data output 327 to catch such less frequent types of errors. Data monitor 328 may be coupled externally to FPGA 100. Alternatively, data monitor 328 may be implemented in configurable logic of FPGA 100 and coupled to obtain data output therefrom to address identification of such an occasional error. Data monitor 328 may be coupled to display 302 to provide a static image of a data pattern, such as data pattern 400, responsive to such an occasional error to provide a visual indication thereof. However, for repeating or substantially repeating errors, display 302 may be used to provide a visual indication of such errors.

Figure 6:
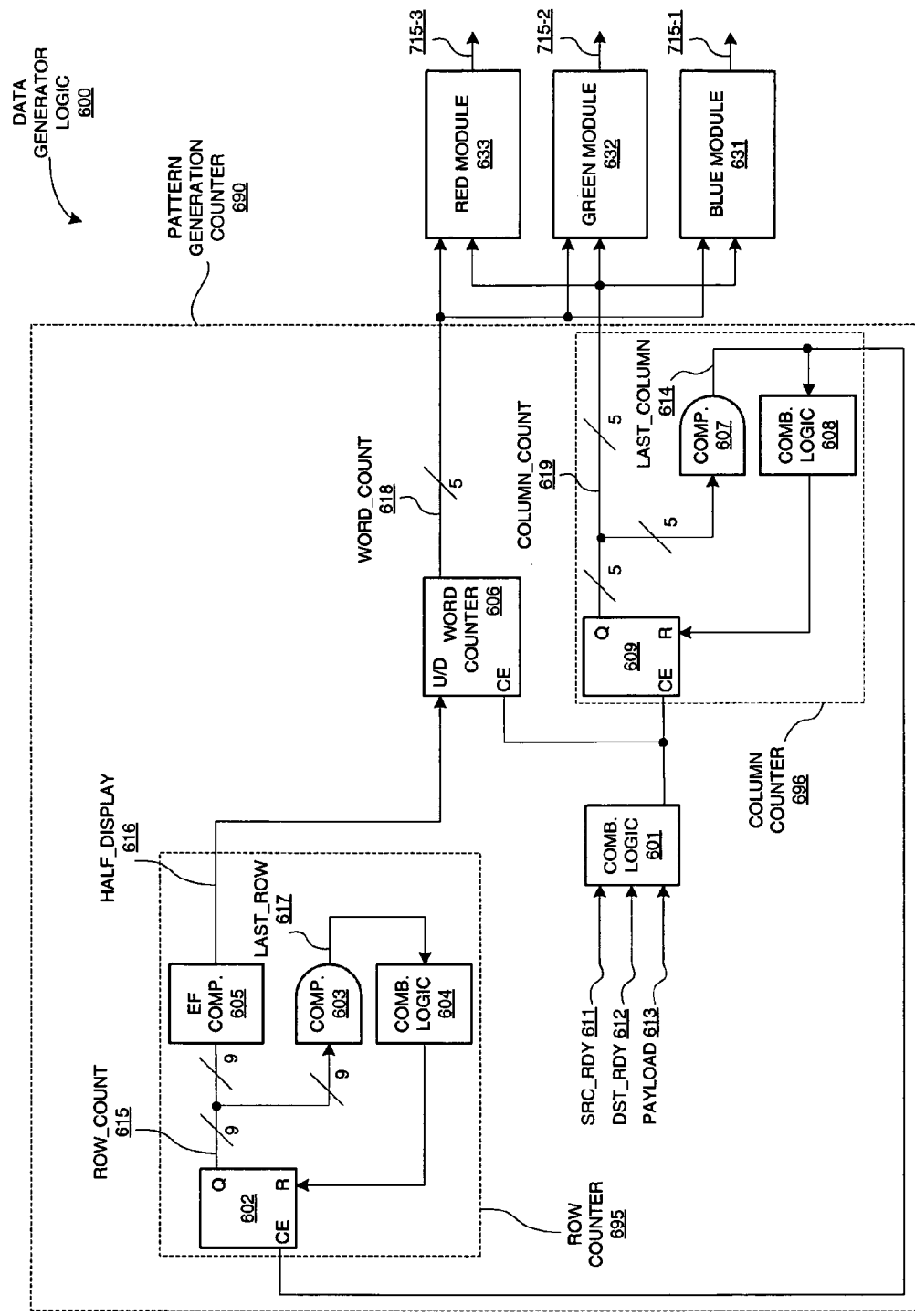
FIG. 6 is a block/schematic diagram depicting an exemplary embodiment of a data generator logic.

FIG. 6 is a block/schematic diagram depicting an exemplary embodiment of data generator logic 600. Data generator logic 600 may be part of data generator logic 202 of FIG. 2. Data generator logic 600 includes pattern generation counter 690 coupled to color modules 631, 632, and 633. Pattern generation counter 690 includes a row counter 695, a column counter 696, and a word counter 606. Source ready signal 611, destination ready signal 612, and payload signal 613 are provided to combinational logic 601. Output of combinational logic 601 is provided to a clock enable port of flip-flops 609 and to a clock enable port of word or up-down counter 606. Up-down counter 606 provides a word count signal 618, which in this implementation is a 5-bit wide signal. Word count signal 618 is for counting up from 0 to 31 or counting down from 31 to 0 depending on direction of brightness increase of pixels, as previously described with reference to FIG. 5.

Output of flip-flops 609 is column count signal 619, which in this example is a 5-bit wide signal. Column count signal 619 is for counting from 0 to 20 as associated with columns or bars 503 previously described with reference to FIG. 5. Word count signal 618 and column count signal 619 are each provided to blue module 631, green module 632, and red module 633. Column count signal 619 may be provided to comparator 607.

Output of comparator 607 is last column signal 614, which is provided to combinational logic 608 and to clock enable ports of flip-flops 602. Thus, for example, when the end of a row is reached, namely the last pixel of a column, row counter 695 is incremented by one by asserting clock enable of flip-flops 602 for one clock cycle. Output of combinational logic 608 is used to reset flip-flops 609. Output of flip-flops 602 is row count signal 615, which in this implementation is a 9-bit wide signal.

Output of flip-flops 602 is provided as an input to end of frame comparator 605. End of frame comparator 605 may be used to determine whether or not an upper or lower section, namely either top section 501 or bottom section 502 of FIG. 5, is having data associated therewith being processed. For example, if output of end of frame comparator 605, namely half display signal 616, indicates that top section 501 of FIG. 5 is being processed, counter 606 counts up from 0 to 31, namely going from zero brightness or black to a maximum brightness in 32 increments. On the other hand, if half display signal 616 indicates bottom section 502 of FIG. 5 is being processed, counter 606 counts down from 31 to 0 to go from a maximum color brightness to black.

Output of flip-flops 602 is provided to comparator 603. Output of comparator 603 is last row signal 617 which is provided to combinational logic 604. Output of combinational logic 604 is provided to a reset port of flip-flops 602. Thus, flip-flops 609 and 602 are reset responsive to a last column and a last row, respectively.

Figure 7:
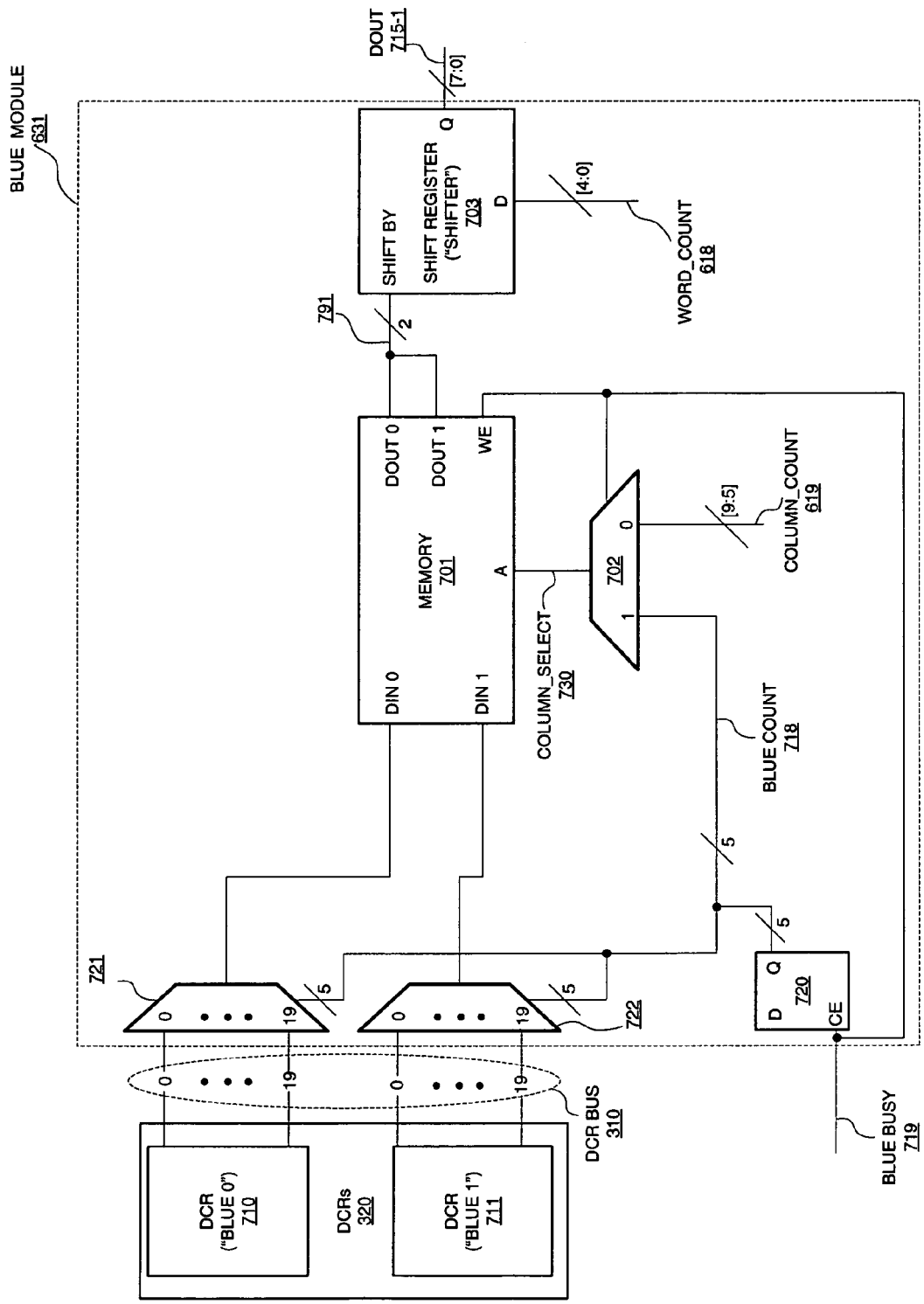
FIG. 7 is a schematic diagram depicting an exemplary embodiment of a blue module.

FIG. 7 is a schematic diagram depicting an exemplary embodiment of a blue module 631. Notably, blue module 631 is similar to green module 632 and red module 633 of FIG. 6, and accordingly only one of these modules is described in detail to avoid repetition. DCRs 320 of FIG. 3 include DCRs 710 and 711, namely "Blue 0" and "Blue 1." Blue 0 and Blue 1 indicate that two DCRs are used for providing blue data. Notably, fewer or more than two registers may be used as will become apparent. Accordingly, each of red module 633 and green module 632 of FIG. 6 may have two respective DCRs associated therewith. DCRs 320 for modules 631, 632, and 633 may contain preloaded values for a maximum color of each of the patterns used, namely 20 patterns in the example provided herein. Moreover, embedded processor 303 of FIG. 3 may update each pattern by writing to DCRs 320. Furthermore, the act of writing to DCRs 320 associated with modules 631, 632, and 633 may be used to initiate an update to a memory associated with such modules, such as memory 701 for blue module 631.

Again, each color, namely red, green, and blue, has two independent colorbar pattern control DCRs, which in the example of FIG. 7 are referenced as Blue 0 and Blue 1, and thus two bits for each of 20 bars or columns are stored in these registers. It should be noted that DCRs for this example are 32 bits wide. Thus each bit in a DCR may correspond to a pixel in a line of a colorbar. A blue busy signal 719 is provided to clock enable ports of flip-flops forming a counter 720. Counter 720 may be used as an arbiter to prevent LocalLink access to streaming data while a DCR update is in progress. Notably, blue busy signal 719 may have counterpart red and green busy signals for red module 633 and green module 632 of FIG. 6. For blue busy signal 719 being asserted, blue count signal 718 output from counter 720 is used to provide select control signaling to multiplexers 721 and 722 of blue module 631. Moreover, this 5-bit wide output from counter 720 for this example is provided as input to multiplexer 702. Furthermore, blue busy signal 719 is provided as a control select input to multiplexer 702, and when blue busy signal 719 is asserted, multiplexer 702 selects output from counter 720 as colorbar column select signal 730 as output from multiplexer 702. Output from multiplexer 702 is provided to an address input port of memory 701.

Assuming blue busy signal 719 is being asserted, data on DCR bus 310 is provided to multiplexers 721 and 722. For 20 colorbars, 20 clock cycles are used to preload memory 701 with colorbar configuration data. Thus, output of multiplexer 721 is selectively provided to data input port 0 of memory 701, and output of multiplexer 722 is selectively provided to data input port 1 of memory 701.

Notably, a DCR write to any of the registers associated with modules 631, 632, and 633 may be used to cause a counter to start counting from 0 to 19 for providing output via DCR bus 310 and asserting a busy signal for preloading memory 701. Pattern generator counter 690 of FIG. 6 is an example of such a counter.

Accordingly, with simultaneous reference to FIGS. 6 and 7, blue module 631 is further described. Counter 606 is a 5-bit counter that generates a count from 0 to 31 for incrementing or decrementing color brightness. This 5-bit value, called a word as referenced to word count signal 618, is fed into shift register ("shifter") 703 to generate an 8-bit output in response to such incoming 5-bit count value. Position of each 5-bit word of word count signal 618 within 8-bit output data signal 715-1 is controlled by shifter 703 responsive to shift-by input bits 791. Notably each color module 632 and 633 produces an associated 8-bit wide output, namely outputs 715-2 and 715-3, respectively. Accordingly, data output signal 715-1, which in this example is bits 0 through 7, is for color blue. An associated output signal for green module 632 may be data output bits 8 through 15, and still a further associated signal for red module 633 may be data output bits 16 through 23. Output signals 715-1, 715-2, and 715-3 from blue module 631, green module 632, and red module 633, respectively, may be concatenated along with a static value, as mentioned elsewhere herein, to provide per pixel output data, namely per pixel LocalLink data in this example. Notably, the static value is to delineate per pixel data.

Figure 8:
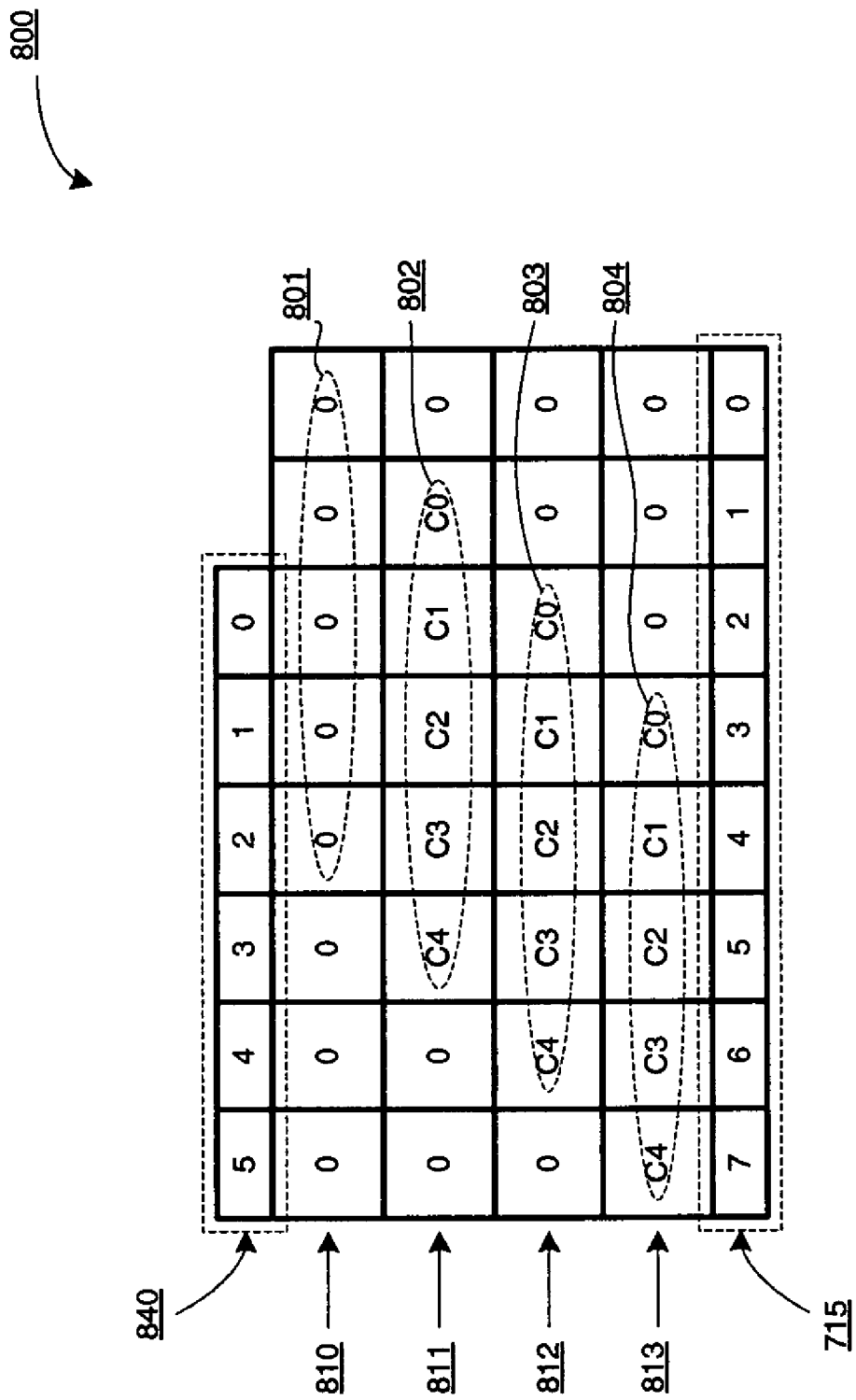
FIG. 8 is a table diagram of a brightness bit-shift table.

With continuing reference to FIGS. 6 and 7, and additional reference to the table diagram of FIG. 8, where there is shown a brightness bit-shift table 800, blue module 631 is further described. Assuming two bits provided to data input port 0 and data input port 1 of memory 701 have been loaded for each column to be displayed, memory 701 will have a preloaded starting brightness value for each column. Responsive to destination ready signal 612 being asserted, and blue busy signal 719 not being asserted, column count 619 provided as an input to multiplexer 702 is selected for output therefrom to an address port of memory 701. Furthermore, word count signal 618 is provided to a data port of shifter 703. Notably, blue busy signal 719 is provided to a write enable port of memory 701. Thus, when blue busy signal 719 is asserted, memory 701 is conditioned for being preloaded with data from DCRs 710 and 711. However, when blue busy signal 719 is not asserted, memory 701 may be put in a read enable state. No separate read enable port is shown for purposes of clarity, as memory 701 may be put in a state ready for reading when write enable is not active and memory 701 receives an address.

Thus, column count signal 619, which counts from 0 to 19, provides an address for each colorbar starting data point stored in memory 701, which in this example is a 2-bit value. For this example, table 800 has four rows 810, 811, 812, and 813. Row 810 represents 0% of maximum brightness. Row 811 represents 25% of maximum brightness. Row 812 represents 50% of maximum brightness. Row 813 represents 100% of maximum brightness. Thus, brightness of any given color may vary from black to black, 25%, 50%, or 100% brightness. Notably, there may be a need to have a black output from at least one of outputs 715-1 through 715-3 so that colors may be made which do not require one or more of the primary colors. For example, cyan requires green and blue but no red.

The 2-bits output from data output port 0 and data output port 1 of memory 701, as indicated by reference number 791, are provided to a shift-by port of shifter 703. Thus, if DCRs 710 and 711 had provided a 0 and a 0 to memory 701 for a colorbar, this 0 and 0 would correspond to row 810 of table 800, meaning there would be a 0% of maximum brightness adjustment. This pattern may be repeated, where 00, 01, 10, and 11 correspond to rows 810, 811, 812, and 813, respectively. Thus shifter 703 receives word count signal 618, which is 5 bits, and if shift-by input 00 is received for such a word count, bits 801 of table 800 are used to set a brightness value associated with display brightness value bits 840. If, however, shift-by input is 01, then the 5 bits of word count signal 618 are shifted by 1, and bits 802 are used for display brightness value bits 840. Furthermore, if shift-by input is 10 as received to the shift-by port of shifter 703 for a word count signal 618, then bits 803 are used for display brightness value bits 840. Lastly, if shifter 703 receives a 11 to its shift-by port, the corresponding word count signal 618 bits are shifted by three places, meaning that bits 804 of table 800 are used for display brightness value 840. Notably, all eight bits on any of rows 810, 811, 812, and 813 may be provided as part of a data output, such as data output 715-1, though only five of the eight bits are used to set a display brightness value 840 within a per pixel data block. Thus, it should be appreciated that word count signal 618 counts from 0 to 31 for each pixel, and data output 715-1 will set a change in brightness associated with each pixel according to input to the shift-by port of shifter 703. In other words, an initial brightness is divided into 32 equal increments, where the initial brightness may be increased, or decreased, by some percentage. Thus, upper bits of output from pattern generation counter 690, namely column count signal 619, are used to address memory 701, namely bits [9:5] in this example, in order to read out shift-by value 791. These upper five bits of column count signal 619 act as a pattern address to indicate which pattern data generator logic 600 is currently processing. By walking through 32 pixels using word count signal 618, namely lower bits [4:0], each pattern may be sent across a LocalLink interface, such as LocalLink interface 314 of FIG. 3. Thus, an entire payload for a LocalLink interface in this example is composed of 20 patterns, namely a single line of video data. Moreover, data generator logic 600 monitors the number of payloads that are being sent. In this example, every 240 LocalLink frames, or 240 video lines, cause data generator logic 600 to switch word count signal 618 from incrementing to decrementing. When data generator logic 600 starts, word count signal 618 therefore runs from black to a maximum color in 32 increments, but when 240 payloads have been sent, word count signal 618 switches to decrementing and video data runs from a maximum color to black.

Because a clock enable port to data generator logic 600 is used for write enabling memory 701, all locations in memory 701 for a data pattern may be updated by associated entries in DCRs 710 and 711. Again, there are separate blue, red, and green busy signals, as only one color is updated at a time, where each DCR write initiates a rewrite to the appropriate memory 701.

To recap, row counter 695 counts the number of video lines and is reset once 480 lines have been sent through a LocalLink interface. Column counter 696 counts the number of pixels in a line and is reset after 640 words have been sent. Word counter 606 counts the number of pixels for the width of each pattern and is reset after 32 words, or pixels, have been sent. Thus, word counter 606 produces a gradient for each colorbar. If row counter 695 has a count that is less than 240, word counter 606 starts at 0 and counts to 31. If, however, row counter 695 has a count that is greater than or equal to 240, word counter 606 starts at 31 and counts down to 0. Again, upper bits of the output of column counter 696 are used to address memories of modules 631 through 633 to produce a shift value for each color. If the shift value is 0, the color is set to 0. Otherwise, the word count value of word count signal 618 is shifted by the amount indicated by output of memory 701. The maximum value for a color is either off, 25% on, 50% on, or 100% on.

Figure 9:
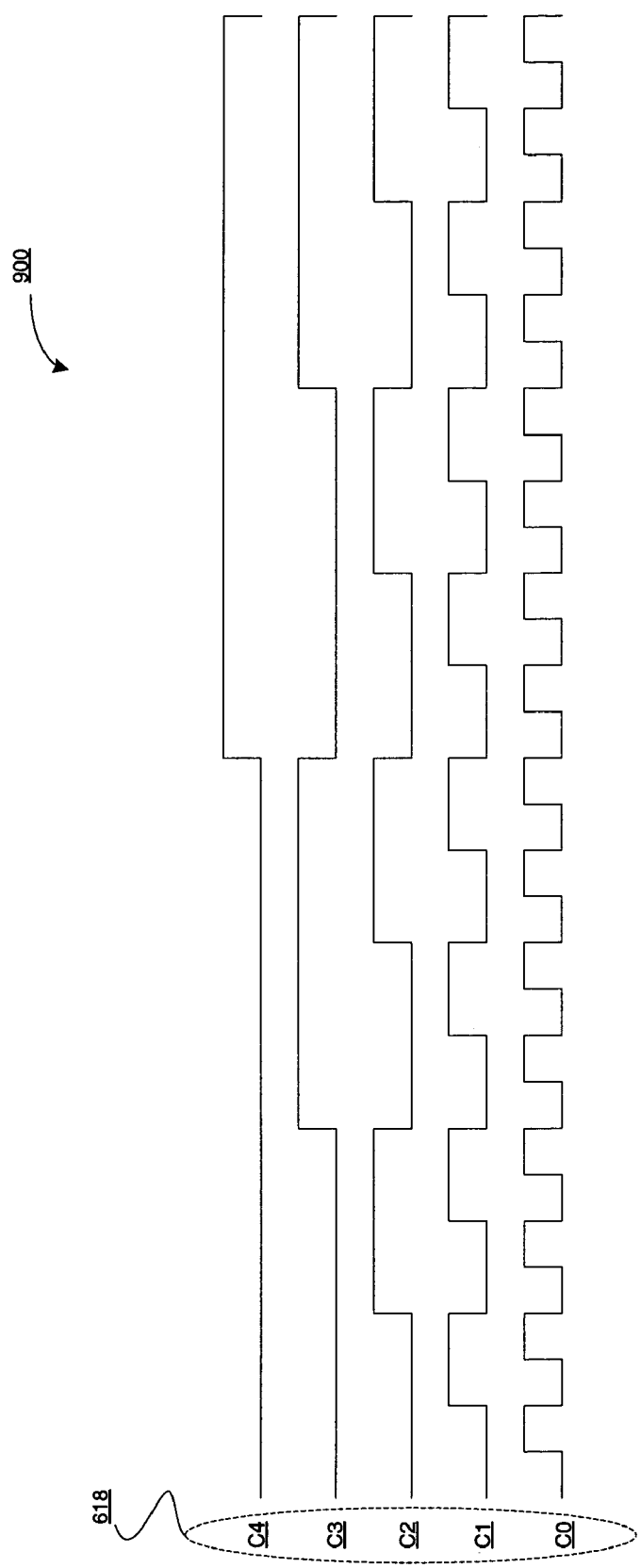
FIG. 9 is a timing diagram depicting an exemplary embodiment of word count timing.

FIG. 9 is a timing diagram 900 depicting an exemplary embodiment of word count timing. As illustratively shown in FIG. 8, there may be count 0 ("C0") through count 4 ("C4") signals for word count signal 618 of FIGS. 6 and 7. Each period of a count signal is successively doubled, such as from C0 to C1, for example.

FIG. 10 is a high-level block diagram depicting an exemplary embodiment of a register interface 1000 for programming data generator 200 of FIG. 2. With simultaneous reference to FIGS. 2, 3, 6, and 10, register interface 1000 is further described.

Registers 1001 through 1010 of DCR registers 320 are provided for access to data generator 200 to control color of patterns being generated, as well as altering performance and LocalLink interface logic 203. Notably, user programming of registers 1001 through 1010 are optional, as default values of registers 1001 through 1010 provide for a default color bar pattern, as well as a default data streaming speed. The default data streaming speed may be the fastest speed available.

In the example embodiment, data generator 200 defines 10 DCR locations respectively for registers 1001 through 1010. Registers 1002 through 1007 are for color pattern control. In particular, registers 1002 and 1003, namely Red 0 and Red 1, are for controlling red color settings. Registers 1004 and 1005, namely Green 0 and Green 1 are for controlling green color settings. Registers 1006 and 1007, namely Blue 0 and Blue 1 are for controlling blue color settings.

Of DCRs 320, there may be control registers 1001, 1008, 1009, and 1010, which may be used to control source ready signal, control timing of data, and count the time it takes to send data and determine if such time is sufficient. For example, if data is not transmitted at a sufficiently high rate, a data miss communication may be provided, in which case, transmission may be incrementally increased via an increment of a value in DCR timer miss register 1009. For example, control register 1001 may be used to monitor the amount of time a LocalLink interface spends on transmitting a frame by counting the number of clock cycles it takes to output one line of data, or 640 pixels in the example. If the time exceeds the value contained in DCR timer max register 1008, a miss signal may be used to incrementally increase the value in control register 1009 to increase the LocalLink transmission rate. DCR timer miss register 1009 may be configured to count then number of times that the number of clock cycles, since a frame began being sent, exceeds the value stored in DCR timer max register 1008.

Moreover, control registers may be used to configure when data is sent across a LocalLink interface. Thus, for example, control register 1001 may be used to control application of source ready signal 611. For example, control register 1001 may have a data generator length select bit and a data generator pattern select bit. If both of these bits are off, source ready signal 611 may be asserted for each clock cycle until a destination ready signal 612, such as from CDMAC 308, is asserted. Additionally, control register 1001 may have pattern and length enable bits. The length enable bit setting may be used to control the percentage of time source ready signal 611 is asserted. Additionally, a linear feedback shift registers ("LFSR") or other means for generating pseudo-random numbers may be used. Thus, source ready signal 611 may be asserted whenever the pseudo-random number generated is less than a data generator length setting in control register 1001.

Control register 1010 may in effect provide an on/off switch for data generator 200 to output data. Thus, for example, data generator 200 may output data and return to an idle state after finishing a current line of data responsive to control register 1010 causing data generator to stop outputting data. Control register 1010 may be used to reset data generator 200.

Control registers 1001 and 1010 may be configured to allow a user to enable or disable random assertion of a data ready bit. When this parameter is activated, another parameter may allow a user to specify a percentage of time that the data ready bit should be asserted. If random assertion is disabled, a user may specify whether the data ready bit should be asserted every cycle, or whether the data valid bit should be asserted every specified number of cycles.

Figure 11:
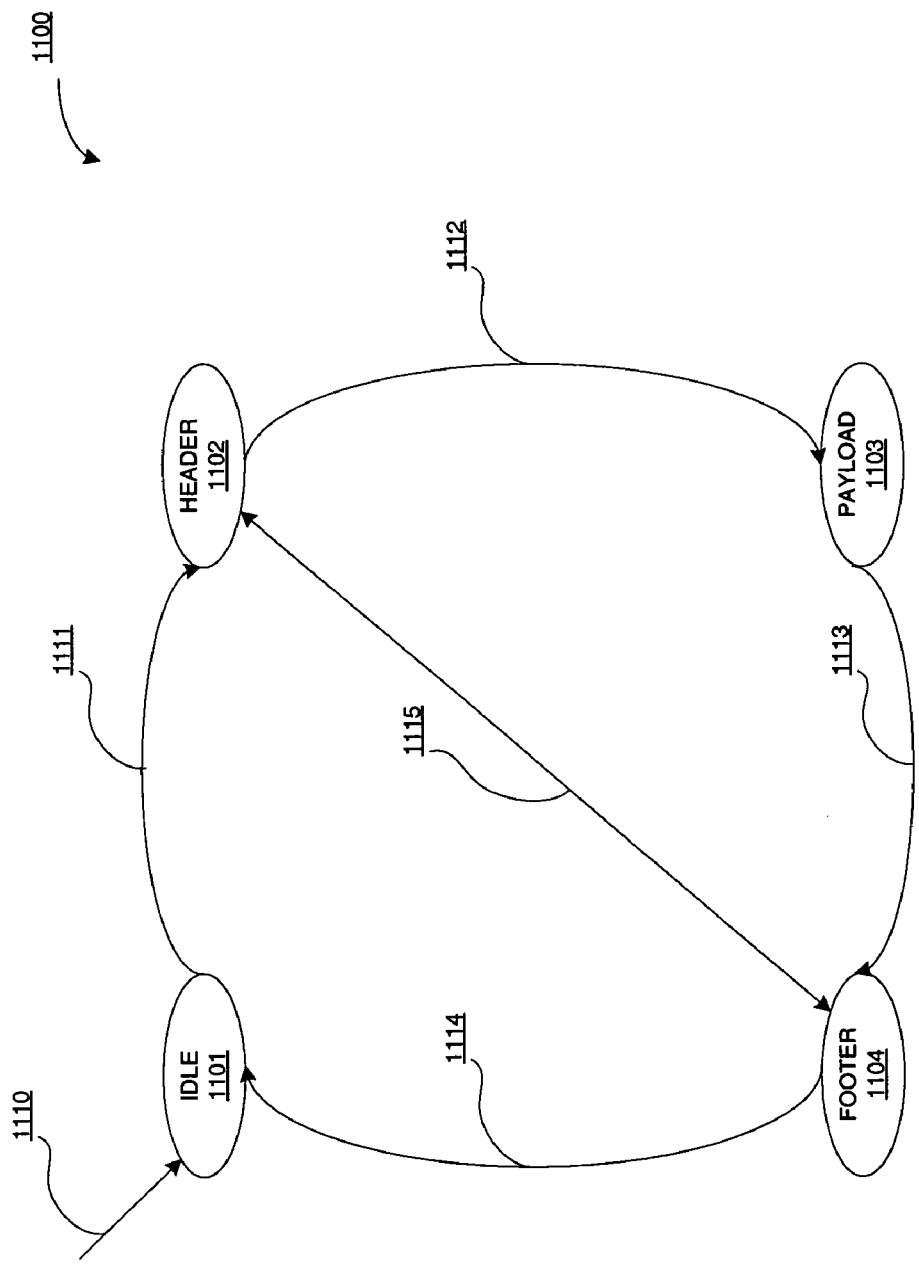
FIG. 11 is a state diagram depicting an exemplary embodiment of a state machine for LocalLink logic of the data generator of FIG. 2.

As described above, a data generator displays 480 lines of data where each line has a header, payload, and footer. A static value is used to delineate between words, as there are 640 words of data in a payload. FIG. 11 is a state diagram depicting an exemplary embodiment of a state machine 1100 for LocalLink logic 203 of data generator 200 of FIG. 2. State machine 1100 may be used for control of source ready and destination ready signals, for providing such header, payload, and footer.

Responsive to a system reset 1110, state machine 1100 is put in idle state 1101. Responsive to a colorbar on signal, a source ready signal, and a destination ready signal being asserted, namely condition 1111, state machine 1100 transitions from idle state 1101 to header state 1102 for transmission of a header. Responsive to condition 1111 and a footer count signal being equal to a predetermined value, namely the combination being condition 1115, state machine 1100 transitions from header state 1102 to footer state 1104 for transmission of a footer. Notably, if state machine 1100 is in footer state 1104 and condition 1115 is met, state machine 1100 transitions from footer state 1104 to header state 1102. From header state 1102, state machine 1100 transitions to payload state 1103 responsive to the source and destination signals being asserted and the footer count not being equal to the predetermined value, namely condition 1112. Payload state 1103 is for transmission of payload data. Thus once a column count signal is equal to an associated threshold value and the source and destination signals are still asserted, namely, condition 1113, state machine 1100 transitions from payload state 1103 to footer state 1104. From footer state 1104, state machine 1100 transitions back to idle state 1101 responsive to conditions of condition 1114 being met, as well as the colorbar on signal not being asserted.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A system for testing a circuit under test, the system comprising:
   an integrated circuit coupled to at least one device selected from the group consisting of a data monitoring device and a display device, the integrated circuit including:
      a data generator coupled to the circuit under test via a first data interface, the data generator configured to generate a predictable data pattern for the circuit under test, the predictable data pattern being associated with a display on a screen; and
      a display controller coupled to the circuit under test via a second data interface; and
   configuration registers coupled to the data generator, the configuration registers programmable to adjust the predictable data pattern to provide a revised predictable data pattern;
   wherein the at least one device is coupled to the display controller;
   wherein the predictable data pattern is associated with a screen image pattern and provided to the circuit under test to obtain a predictable test result image responsive thereto for the display controller;
   wherein receipt of a test image result directly indicates performance of the circuit under test;
   wherein when the test image result is equivalent to the predictable test result image a level of acceptance of the circuit under test is indicated;
   wherein the data generator includes a data streaming interface for communication with the first interface, and wherein the data generator includes a configuration register interface for communication with the configuration registers; and
   wherein the data generator is instantiated in configurable logic of the integrated circuit.

2. The system according to claim 1, further comprising a microprocessor in communication with the configuration registers for writing configuration data thereto.

3. The system according to claim 2, wherein the microprocessor is internal to the integrated circuit, and wherein the configuration registers are internal to the microprocessor.

4. The system according to claim 1, wherein the circuit under test is instantiated in the configurable logic of the integrated circuit, and wherein the integrated circuit is a programmable logic device.

5. The system according to claim 4, wherein the programmable logic device is a Field Programmable Gate Array.

6. The system according to claim 1, wherein the circuit under test is external to the integrated circuit.

7. A data generator comprising:
   a pattern generation counter configured to count pixel information, row information, and column information for displaying a data test pattern on a display screen, the data test pattern divided into groups of pixels divided out by rows and columns;
   display modules coupled to the pattern generation counter, the display modules configured to gradually adjust brightness of the pixel information for the data test pattern;
   wherein the pattern generation counter includes a row counter, a column counter, and a word counter;
   wherein the row counter is configured to count lines associated with a display resolution, the display resolution being associated with the displaying of the data test pattern on the display screen, and the lines being associated with a vertical component of the display resolution;
   wherein the column counter is configured to count sections of the display resolution, the sections being associated with columnar segmentation of a horizontal component of the display resolution;
   wherein the word counter is configured to count the pixel information for each group of the groups of pixels within a section of the sections
   wherein the row counter is coupled to the word counter; and
   wherein the row counter is configured to provide a display division indication to the word counter, the display division indication being for indicating when to switch counting the pixel information from a first direction to a second direction.

8. The data generator according to claim 7, wherein the column counter is coupled to the row counter, the column counter configured to provide last columnar section indication to increment the row counter.

9. The data generator according to claim 7, wherein each of the display modules have memory and a shift register, the memory coupled to the shift register to provide a brightness adjustment value thereto, the memory having stored therein the brightness adjustment value for the section of the sections.

10. The data generator according to claim 9, wherein the brightness adjustment value is provided from the memory responsive to output from the column counter.

11. The data generator according to claim 10, wherein the shift register is coupled to output of the word counter to provide color information for the section of the sections in combination with the brightness adjustment value.

12. The data generator according to claim 11, wherein the color information provided from the display modules includes blue color information, green color information, and red color information, the display modules including a first module for generating blue color information, a second module for generating green color information, and a third module for generating red color information.

13. The data generator according to claim 12, wherein the blue color information, the green color information, and the red color information is incrementally increased from pixelto-pixel in brightness responsive to the brightness adjustment value for each group of pixels of the groups of pixels and responsive to the display division indication, and wherein the blue color information, the green color information, and the red color information is combined to provide the pixel information successively adjusted for an upper part of the data test pattern.

14. The data generator according to claim 12, wherein the blue color information, the green color information, and the red color information is incrementally decreased from pixel-to-pixel in brightness responsive to the brightness adjustment value for each group of pixels of the groups of pixels and responsive to the display division indication, and wherein the blue color information, the green color information, and the red color information is combined to provide the pixel information successively adjusted for a lower part of the data test pattern.

15. A system for providing a data test pattern for testing a circuit, the system comprising:

means for counting rows associated with a vertical component of a display resolution;

means for counting columns associated with pixel groupings, the pixel groupings being for a columnar segmentation of a horizontal component of the display resolution;

for an upper portion of the data test pattern, means for up counting each pixel within the pixel groupings, the up counting being for counting a first portion of the rows associated with the upper portion of the data test pattern;

for a lower portion of the data test pattern, means for down counting each pixel within the pixel groupings, the down counting being for counting a second portion of the rows associated with the lower portion of the data test pattern;

means for generating gradually adjusted first, second and third color information responsive to the column counting and the up counting for combination of the first, second, and third color information for each said pixel within the pixel groupings in the upper portion of the data test pattern; and means for generating gradually adjusted first, second and third color information responsive to the column counting and the down counting for combination of the first, second, and third color information for each said pixel within the pixel groupings in the lower portion of the data test pattern.

\* \* \* \* \*